(12) United States Patent
Deng et al.

(10) Patent No.: US 9,634,773 B2
(45) Date of Patent: Apr. 25, 2017

(54) METHOD AND DEVICE FOR SUPPRESSING HARMONIC SIGNALS

(71) Applicant: MStar Semiconductor, Inc., Hsinchu Hsien (TW)

(72) Inventors: Jun-Xiong Deng, Shanghai (CN); Li-Wei Sheng, Irvine, CA (US)

(73) Assignee: MSTAR SEMICONDUCTOR, INC., Hsinchu Hsien (TW)

( * ) Notice: Subject to any disclaimer, the term of this patent is extended or adjusted under 35 U.S.C. 154(b) by 22 days.

(21) Appl. No.: 14/703,389

(22) Filed: May 4, 2015

(65) Prior Publication Data

US 2015/0341126 A1 Nov. 26, 2015

(30) Foreign Application Priority Data

May 22, 2014 (CN) .......................... 2014 1 0220141

(51) Int. Cl.
| | | |
|---|---|---|
| *H04B 1/40* | (2015.01) | |
| *H04B 15/02* | (2006.01) | |
| *H04B 1/403* | (2015.01) | |
| *H03D 7/14* | (2006.01) | |
| *H03D 7/16* | (2006.01) | |

(52) U.S. Cl.
CPC ........... *H04B 15/02* (2013.01); *H03D 7/1441* (2013.01); *H03D 7/1458* (2013.01); *H03D 7/165* (2013.01); *H04B 1/403* (2013.01); *H03D 2200/0088* (2013.01)

(58) Field of Classification Search
CPC ...... H04B 15/02; H04B 1/403; H03D 7/1441; H03D 7/165; H03D 7/1458; H03D 2200/0088
See application file for complete search history.

(56) References Cited

U.S. PATENT DOCUMENTS

| | | | |
|---|---|---|---|
| 7,130,604 B1 | 10/2006 | Wong et al. | |
| 2015/0094004 A1* | 4/2015 | Vora .................. | H03D 7/166 |
| | | | 455/114.1 |
| 2015/0180521 A1* | 6/2015 | Tripurari ............ | H03D 7/1441 |
| | | | 375/349 |

FOREIGN PATENT DOCUMENTS

| | | |
|---|---|---|
| CN | 102754332 | 10/2012 |
| WO | 8809685 | 12/1988 |
| WO | 2011156607 | 12/2011 |

OTHER PUBLICATIONS

H. Yang et al., "Mixers of Ultra-High Gain from 5.0 to 18.0 GHz," Wireless Engineering and Technology, vol. 4 No. 1, 2013, pp. 1-4. doi: 10.4236/wet.2013.41001.

(Continued)

*Primary Examiner* — Xin Jia
(74) *Attorney, Agent, or Firm* — WPAT, PC; Justin King; Douglas A. Hosack

(57) ABSTRACT

A method for suppressing harmonic signals includes: mixing a first local oscillation signal with an input signal to obtain a first output signal, and mixing a second local oscillation signal with the input signal to obtain a second output signal, the first output signal including an n-order harmonic signal, n being a positive integer greater than 1; and adding the first output signal and the second output signal to suppress the n-order harmonic signal in the first output signal. The first local oscillation signal and the second local oscillation signal have different mark-space ratios but a same oscillation frequency.

16 Claims, 7 Drawing Sheets

(56) References Cited

OTHER PUBLICATIONS

Taiwan Intellectual Property Office, Office Action issued May 25, 2016.
State Intellectual Property Office of the People's Republic of China (SIPO), Office Action issued Aug. 2, 2016.
State Intellectual Property Office of the People's Republic of China, Office Action issued Dec. 9, 2016.

* cited by examiner

METHOD AND DEVICE FOR SUPPRESSING HARMONIC SIGNALS

This application claims the benefit of People's Republic of China application Serial No. 201410220141.4, filed May 22, 2014, the subject matter of which is incorporated herein by reference.

BACKGROUND OF THE INVENTION

Field of the Invention

The invention relates in general to wireless communication technologies, and more particularly to a method and device for suppressing harmonic signals.

Description of the Related Art

In current technologies, radio-frequency (RF) transceivers frequently generate undesired harmonic signals when up-mixing or down-mixing signals. For example, in a signal up-mixing process, i.e., in a filtering and frequency mixing process of baseband signals, due to non-linear characteristics of components for the filter and frequency mixing process, RF signals obtained after the process are often added with harmonic signals in different orders. The presence of the harmonic signals greatly degrades the performance of the RF transceiver. For example, an adjacent channel leakage ratio is reduced or a signal-to-noise ratio within the band is deteriorated. Therefore, there is a need for a solution for suppressing harmonic signals during an operation process of an RF transceiver to enhance the performance of the RF transceiver.

SUMMARY OF THE INVENTION

The invention is directed to a method and device for suppressing harmonic signals. Thus, harmonic signals generated in a frequency mixing process can be suppressed by a simple approach to enhance the performance of an RF transceiver.

The present invention provides a method for suppressing harmonic signals. The method includes steps of: mixing a first local oscillation signal with an input signal to obtain a first output signal, and mixing a second local oscillation signal with the input signal to obtain a second output signal, the first output signal including an n-order harmonic signal, n being a positive integer greater than 1; and adding the first output signal and the second output signal to suppress the n-order harmonic signal in the first output signal. The first local oscillation signal and the second local oscillation signal have different mark-space ratios but a same oscillation frequency.

The present invention further provides a device for suppressing harmonic signals. The device includes a mixer and an adding module. The mixer includes a first mixing module, configured to mix a first local oscillation signal with an input signal to obtain a first output signal, which includes an n-order harmonic signal, n being a positive integer greater than 1; and a second mixing module, configured to mix a second local oscillation signal with the input signal to obtain a second output signal. The adding module is configured to add the first output signal and the second output signal to suppress the n-order harmonic signal in the first output signal. The first local oscillation signal and the second local oscillation signal have different mark-space ratios but a same oscillation frequency.

The above and other aspects of the invention will become better understood with regard to the following detailed description of the preferred but non-limiting embodiments. The following description is made with reference to the accompanying drawings.

DETAILED DESCRIPTION OF THE INVENTION

Throughout the specification and claims, certain terms are used to refer to specific elements. One person skilled in the art can understand that, manufacturers may use different terms to refer to the same elements. In the specification and claims, the elements are distinguished by functional differences but not differences in the terms. Details of embodiments of the present invention are described below with reference to the accompanying drawings.

Figure 1:
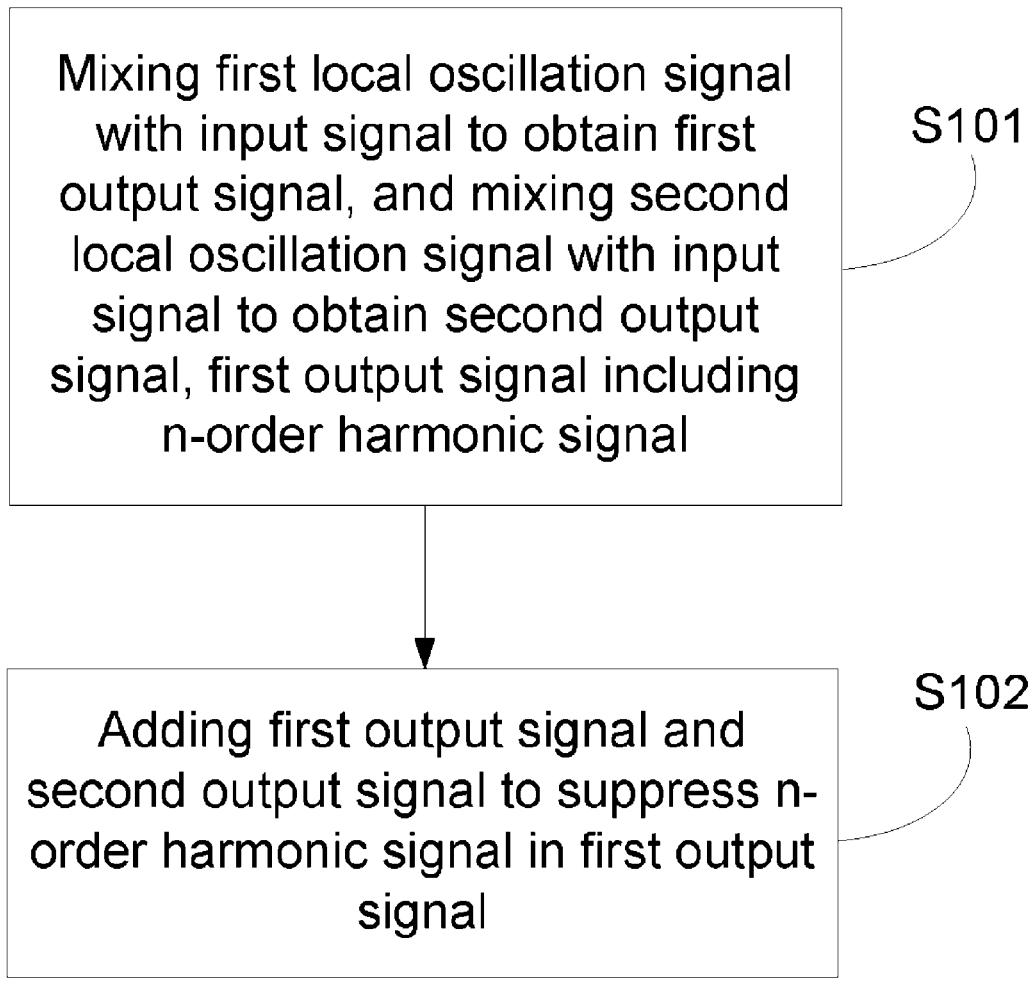
FIG. 1 is a flowchart of a method for suppressing harmonic signals according to a first embodiment of the present invention.

FIG. 1 shows a flowchart of a method for suppressing harmonic signals according to a first embodiment of the present invention. It should be noted that, given that substantially same results are achieved, the method of the present invention may be implemented in an order other than that shown in FIG. 1. As shown in FIG. 1, the method includes following steps.

In step S101, a first local oscillation signal is mixed with an input signal to obtain a first output signal, and a second local oscillation signal is mixed with the input signal to obtain a second output signal. The first output signal includes an n-order harmonic signal.

In step S102, the first output signal and the second output signal are added to suppress the n-order harmonic signal in the first output signal.

In step S101, the input signal may be a baseband signal or a radio-frequency (RF) signal. The first local oscillation signal and the second local oscillation signal are square-wave signals, and have different mark-space ratios but the same local oscillation frequency. The n-order harmonic signal includes a three-order harmonic signal and a five-order harmonic signal. Wherein, n is a ratio of the frequency of the harmonic signal to the frequency of a fundamental signal, i.e., a usable signal, and is a positive integer greater than 1.

Known to one skilled person in the art, in the process of mixing the first local oscillation signal with the input signal to obtain the first output signal, due to non-linear characteristics of components implementing the frequency mixing function, a harmonic signal having a frequency that is n-order to a local oscillation frequency is often added in the first output signal. Similarly, in the process of mixing the second local oscillation signal with the input signal to obtain the second output signal, a harmonic signal having a frequency that is n-order to a local oscillation frequency is also often added in the second output signal.

In step S102, as the first local oscillation signal and the second local oscillation signal have the same local oscillation frequency, the harmonic signals having the same order in the added first and second output signals are located at the same frequency point. Meanwhile, as the first local oscillation signal and the second local oscillation signal have different mark-space ratios, for harmonic signals in certain orders, the harmonic signals having the same order in the added first and second output signals have opposite phases. Therefore, when adding the first output signal and the second output signal, in the two signals, harmonic signals having the same order have the same frequency but opposite phases, such that the harmonic signals in these orders in the first output signal can be suppressed.

Different from the prior art, in the present invention, an input signal is respectively mixed with local oscillation signals having different mark-space ratios but the same local oscillation frequency, and resultant output signals are added. Thus, the harmonic signals generated in the process of frequency mixing are suppressed to further enhance the performance of an RF transceiver. Such process is simple and easily implemented.

Figure 2:
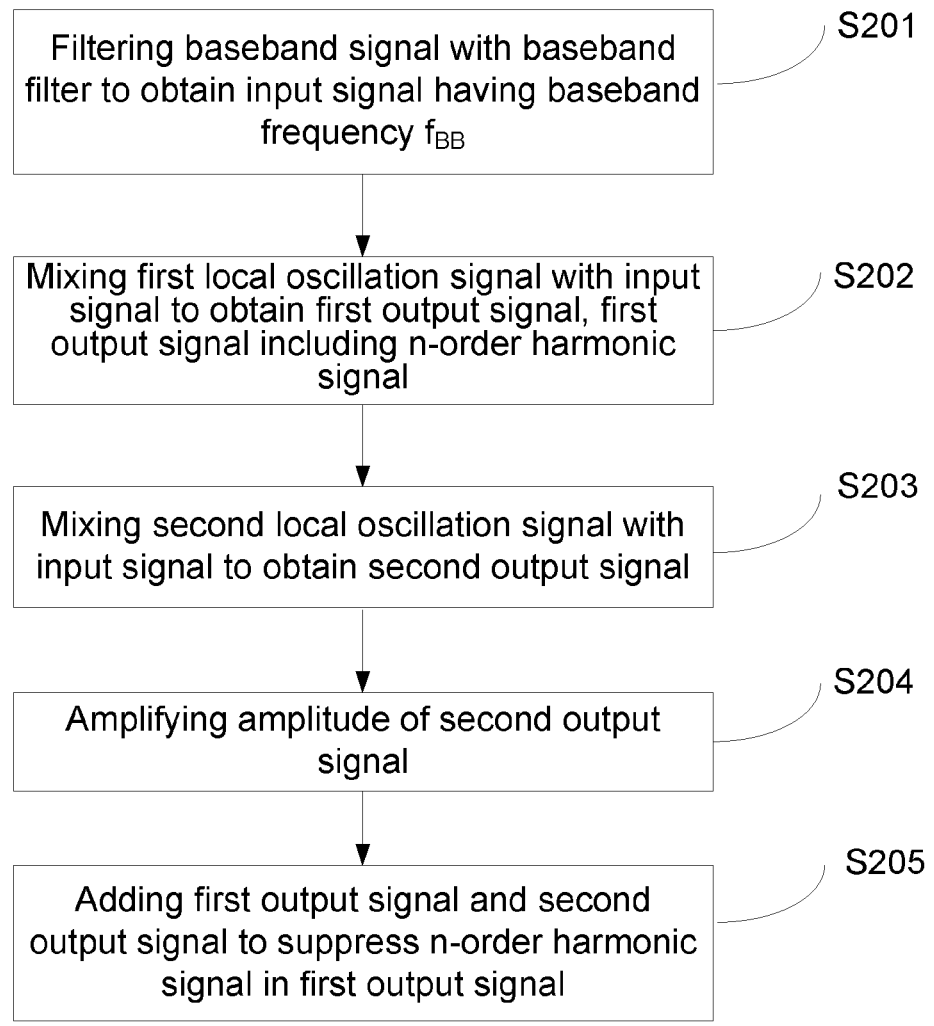
FIG. 2 is a flowchart of a method for suppressing harmonic signals according to a second embodiment of the present invention.

FIG. 2 is a flowchart of a method for suppressing harmonic signals according to an embodiment of the present invention. It should be noted that, given that substantially same results are achieved, the method of the present invention may be implemented in an order other than that shown in FIG. 2. As shown in FIG. 2, the method includes following steps.

In step S201, a baseband signal is filtered with a baseband filter to obtain an input signal having a baseband frequency $f_{BB}$. In step S201, the baseband filter is applied in a transmitting circuit of an RF transceiver. In following steps, mixing refers to up-mixing. Due to non-linear characteristics of the baseband filter, in addition to a fundamental signal having a baseband frequency $f_{BB}$, i.e., the usable signal, the input signal further includes a harmonic signal having a frequency $n*f_{BB}$, where n is a positive integer greater than 1.

In step S202, a first local oscillation signal is mixed with the input signal to obtain a first output signal, which includes an n-order harmonic signal. In step S202, assuming that the first local oscillation signal is a square-wave signal f(x) having a mark-space ratio of 100%, the Fourier calculation is represented as:

$$f(x) = \begin{cases} +1 & 0 < x < \pi \\ -1 & \pi < x < 2\pi \end{cases} = \frac{2}{\pi}\left(\sin(w_1) + \frac{1}{3}\sin(3w_1) + \frac{1}{5}\sin(5w_1) + ...\right)$$

In the above equation, $w_1=2\pi f_{LO1}$, and $f_{LO1}$ is a local oscillation frequency of the first local oscillation signal and has a value ½π.

It is known from the above equation that, in addition to the fundamental signal having a local oscillation frequency $f_{LO1}$, i.e., the usable signal, the first local oscillation signal further includes a harmonic signal having a frequency $n*f_{LO1}$, where n is a positive integer greater than 1. More specifically, the first local oscillation signal further includes a three-order harmonic signal having a frequency $3f_{LO1}$, and a five-order harmonic signal having a frequency $5f_{LO1}$.

In addition to the usable signal having the local oscillation frequency $f_{LO1}$, the first local oscillation signal further includes the harmonic signal having the frequency $n*f_{LO1}$. Meanwhile, in addition to the usable signal having the baseband frequency $f_{BB}$, the input signal further includes the harmonic signal having the frequency $n*f_{BB}$. Therefore, the first output signal obtained from mixing the first local oscillation signal with the input signal, in addition to the usable signal having a frequency $f_{LO1} \pm f_{BB}$, further includes harmonic signals having frequencies $n*f_{LO1} \pm f_{BB}$ and $n*f_{LO1} \pm n*f_{BB}$. More specifically, taking a three-order harmonic signal for example, the first output signal further includes harmonic signals having frequencies $3f_{LO1} \pm f_{BB}$ and $3*f_{LO1} \pm 3*f_{BB}$.

In step S203, a second local oscillation signal is mixed with the input signal to obtain a second output signal. In step S203, assuming that the second local oscillation signal is a square-wave signal f(y) having a mark-space ratio of 50%, the Fourier calculation is represented as:

$$f(y) = \begin{cases} +1 & \pi/4 < y < 3\pi/4 \\ -1 & 5\pi/4 < y < 7\pi/4 \\ 0 & 0 < y < \pi/4, 3\pi/4 < y < 5\pi/4, 7\pi/4 < y < 2\pi \end{cases}$$

$$= \frac{\sqrt{2}}{\pi}\left(\sin(w_2) - \frac{1}{3}\sin(3w_2) - \frac{1}{5}\sin(5w_2) + ...\right)$$

In the above equation, $w_2=2\pi f_{LO2}$, and $f_{LO2}$ is a local oscillation frequency of the second local oscillation signal and has a value ½π.

It is known from the above equation that, the first local oscillation frequency $f_{LO1}$ and the second local oscillation frequency $f_{LO2}$ are the same, i.e., both being ½π, and the phase of the second local oscillation signal is behind the phase of the first local oscillation signal by π/4, i.e., 45 degrees. It should be noted that the phase of the second local oscillation signal being behind the phase of the first local oscillation signal by 45 degrees is an example for illustrating the present invention. In other embodiments, the phase of the second local oscillation signal may be behind or ahead of the phase of the first local oscillation signal, and the value of the phase difference may be values other than 45 degrees.

Further, the second local oscillation signal, in addition to the fundamental signal having the local oscillation frequency $f_{LO2}$, i.e., the usable signal, further includes a harmonic signal having a frequency $n*f_{LO2}$, where n is a positive integer greater than 1. More specifically, the second local oscillation signal further includes a three-order harmonic signal having a frequency $3f_{LO2}$, and a five-order harmonic signal having a frequency $5f_{LO2}$.

Therefore, the second output signal obtained from mixing the second local oscillation signal with the input signal, in addition to the usable signal having a frequency $f_{LO2} \pm f_{BB}$, further includes harmonic signals having frequencies $n*f_{LO2} \pm f_{BB}$ and $n*f_{LO2} \pm n*f_{BB}$.

In step S204, the amplitude of the second output signal is amplified. In step S204, the amplitude of the second output signal is amplified by √2 times, so that the amplitude of the three-order harmonic signal corresponding to the second local oscillation signal and the amplitude of the three-order harmonic signal corresponding to the first local oscillation signal are caused to be the same. More specifically, before the amplification, the amplitude of the three-order harmonic signal corresponding to the second local oscillation signal is $\sqrt{2}/3\pi$; after the amplification, the amplitude of the three-order harmonic signal corresponding to the second local oscillation signal is $2/3\pi$. It should be noted that, the value $\sqrt{2}$ for amplifying the amplitude is given as an example, and such exemplary amplification value for the value $\sqrt{2}$ is not to be construed as a limitation of the present invention.

In step S205, the first output signal and the second output signal are added to suppress the n-order harmonic signal in the first output signal. Taking a harmonic signal having the frequency $3f_{LO1} \pm f_{BB}$ for example, the amplitude of the input signal is set to 1 and the phase is set to 0°. Thus, the amplitude of the harmonic signal having the frequency $3f_{LO1} \pm f_{BB}$ in the first output signal is $2/3\pi$, the amplitude of the harmonic signal having the frequency $3f_{LO2} \pm f_{BB}$ in the amplified second output signal is also $2/3\pi$, and the phase of the harmonic signal having the frequency $3f_{LO1} \pm f_{BB}$ in the first output signal is opposite the phase of the harmonic signal having the frequency $3f_{LO2} \pm f_{BB}$ in the second output signal. At this point, the first output signal and the second output signal are added. As $f_{LO1}$ and $f_{LO2}$ are the same, the harmonic signal having the frequency $3f_{LO1} \pm f_{BB}$ in the first output signal is counteracted by the harmonic signal having the frequency $3f_{LO2} \pm f_{BB}$ and the same amplitude but an opposite phase in the second output signal.

From another perspective, when adding the first output signal and the second output signal, with the same input signal, it is substantially adding the first local oscillation signal and the second local oscillation signal. From perspectives of Fourier expansions of the first local oscillation signal f(x) and the second local oscillation signal f(y), the Fourier expansions of the first local oscillation signal f(x) and the second local oscillation signal f(y) as follows:

$$f(x) = \frac{2}{\pi}\left(\sin(w_1) + \frac{1}{3}\sin(3w_1) + \frac{1}{5}\sin(5w_1) + \ldots\right)$$

$$f(y) = \frac{\sqrt{2}}{\pi}\left(\sin(w_2) - \frac{1}{3}\sin(3w_2) - \frac{1}{5}\sin(5w_2) + \ldots\right)$$

Because the first local oscillation signal and the second local oscillation signal have the same local oscillation frequency, i.e., w1=w2, after amplifying the amplitude of the second output signal by $\sqrt{2}$ times, it can also be understood that after amplifying the amplitude of the second local oscillation signal by $\sqrt{2}$ times, $$f(x) + \sqrt{2} * f(y) = \frac{4}{\pi}\sin(w_1)$$

is obtained after adding the first local oscillation signal with the amplified second local oscillation signal. At this point, the three-order harmonic signal corresponding to 3w1 and the five-order harmonic signal corresponding to 5w1 can be completely counteracted.

One person skilled in the art can understand that, the first local oscillation signal having a mark-space ratio of 100% and the second local oscillation signal having a mark-space ratio of 50% are examples for illustration purposes, and the local oscillation signals of the present invention are not limited to the two mark-space ratios above. Further, the present invention does not limit the number of different mark-space ratios. For example, three or four different mark-space ratios can be applied, and such local oscillation signals are respectively mixed with the input signal and then added, and harmonic signals in other orders, e.g., 7-order and 9-order harmonic signals, can be suppressed.

Different from the prior art, in the present invention, an input signal is respectively mixed with local oscillation signals having different mark-space ratios but the same local oscillation frequency, and resultant output signals are added. Thus, the harmonic signals generated in the process of down-mixing are suppressed to further enhance the performance of an RF transceiver. Such process is simple and easily implemented.

Figure 3:
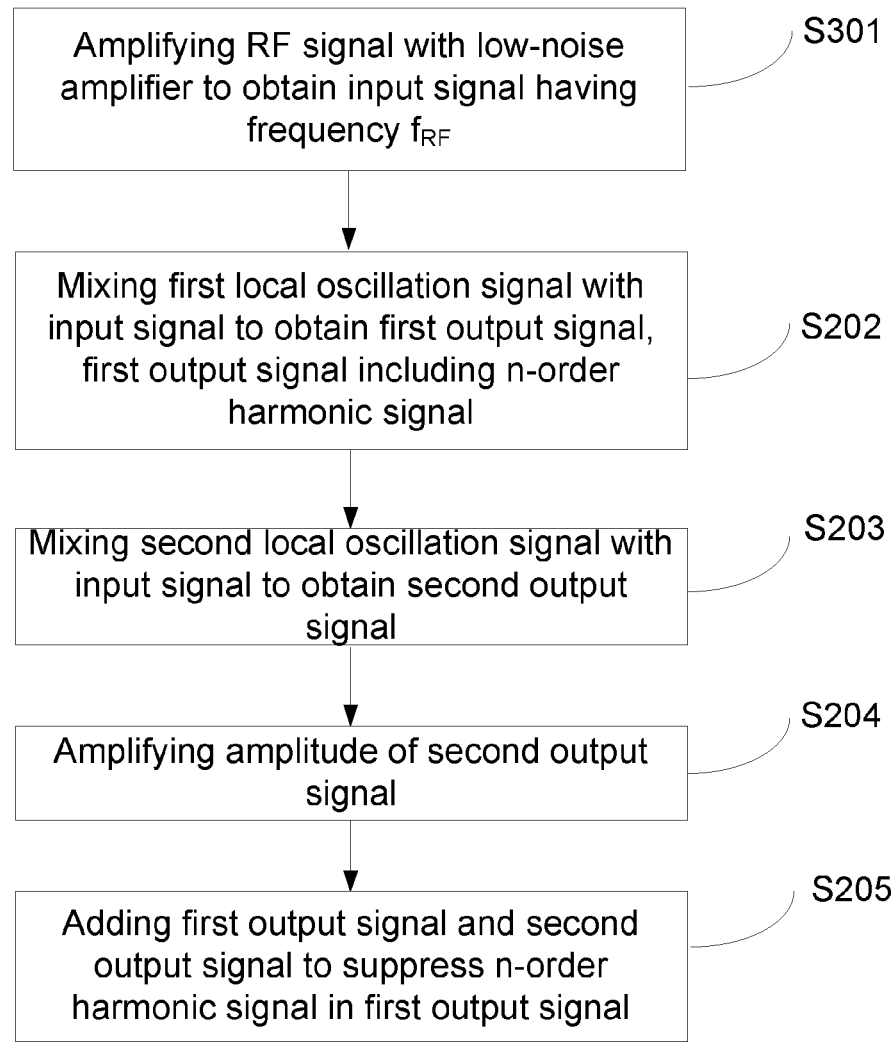
FIG. 3 is a flowchart of a method for suppressing harmonic signals according to a third embodiment of the present invention.

FIG. 3 shows a flowchart of a method for suppressing harmonic signals according to a third embodiment of the present invention. It should be noted that, given that substantially same results are achieved, the method of the present invention may be implemented in an order other than that shown in FIG. 3. As shown in FIG. 3, main differences of the embodiment in FIG. 3 from the second embodiment in FIG. 2 are given below.

In step S301, an RF signal is amplified with a low-noise amplifier (LNA) to obtain an input signal having a frequency $f_{RF}$. In step S301, the LNA is applied in a receiving circuit of an RF transceiver. In following steps, mixing refers to down-mixing. Due to non-linear characteristics of the low-noise filter, in addition to the usable signal having the frequency $f_{RF}$, the input signal further includes a harmonic signal having a frequency $n*f_{RF}$, where n is a positive integer greater than 1.

One person skilled in the art can understand that, the input signal in FIG. 3 is an RF signal that is processed by an LNA, and the input signal in FIG. 2 is a baseband signal that is filtered and processed by a baseband filter. Apart from the input signal, in the methods disclosed in FIG. 3 and FIG. 2, subsequent steps for processing the input signal are similar. For the sake of simplicity, details of other similar steps in the flowchart in FIG. 3 are omitted herein.

Different from the prior art, in the present invention, an RF signal is amplified with an LNA to obtain an input signal, the input signal is mixed with local oscillation signals having different mark-space ratios but the same local oscillation frequency, and resultant output signals are added. Thus, the harmonic signals generated in the process of down-mixing are suppressed to further enhance the performance of an RF transceiver. Such process is simple and easily implemented.

Figure 4:
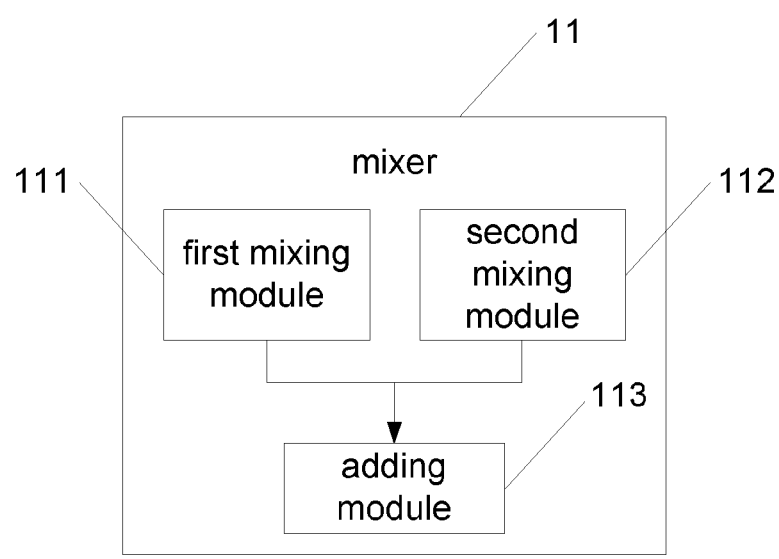
FIG. 4 is a schematic diagram of a device for suppressing harmonic signals according to the first embodiment of the present invention.

FIG. 4 shows a schematic diagram of a device for suppressing harmonic signals according to the first embodiment of the present invention. As shown in FIG. 4, the device includes a mixer 11. The mixer 11 includes a first mixing module 111, a second mixing module 112 and an adding module 113.

The first mixing module 111 mixes a first local oscillation signal with an input signal to obtain a first output signal. The output signal includes an n-order harmonic signal, where n is a positive integer greater than 1. More specifically, the n-harmonic signal includes a three-order harmonic signal and a five-order harmonic signal.

The second mixing module 112 mixes a second local oscillation signal with the input signal to obtain a second output signal.

The adding module 113 is coupled to the first mixing module 111 and the second mixing module 112, and adds the first output signal and the second output signal to suppress the n-order harmonic signal in the first output signal. The first local oscillation signal and the second local oscillation signal have different mark-space ratios but the same local oscillation frequency.

Figure 5:
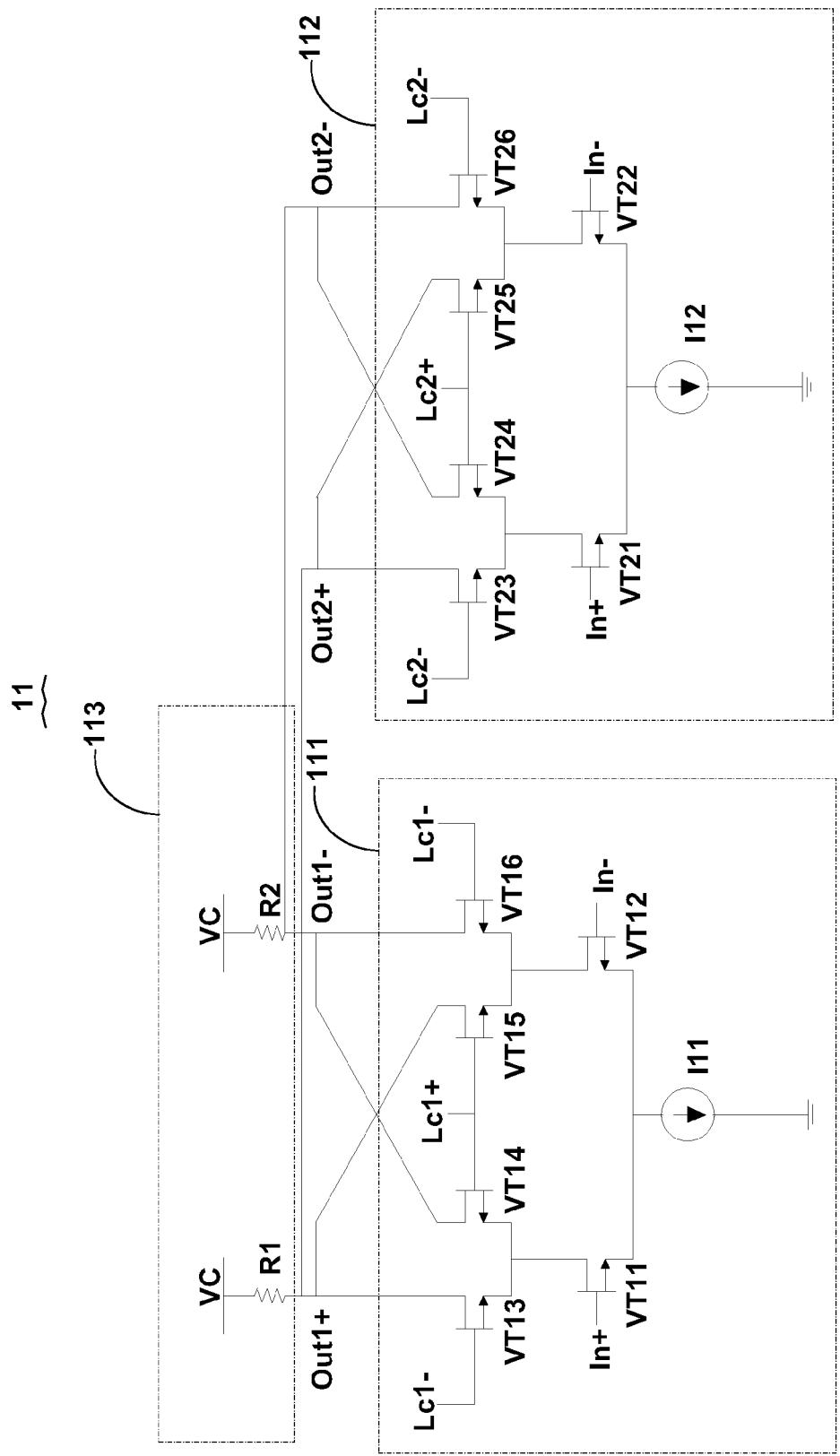
FIG. 5 is a circuit diagram of a mixer in FIG. 4.

FIG. 5 shows a circuit diagram of the mixer in FIG. 4. As shown in FIG. 5, the mixer 11 includes the first mixing module 111, the second mixing module 112 and the adding module 113.

The first mixing module 111 includes a transistor VT11, a transistor VT12, a transistor VT13, a transistor VT14, a transistor VT15, a transistor VT16 and a constant current source I11. A gate of the transistor VT11 is coupled to a positive input end In+ of the input signal, and a gate of the transistor VT12 is coupled to a negative input end In− of the input signal. Sources of the transistors VT11 and VT12 are coupled to an anode of the constant current source I11, and a cathode of the constant current source I11 is grounded. A drain of the transistor VT11 is coupled to sources of the transistors VT13 and VT14. A drain of the transistor VT12 is coupled to sources of the transistors VT15 and VT16. Gates of the transistor VT13 and VT16 are coupled to a negative input end Lc1− of the first local oscillation signal, and gates of the transistors VT14 and VT15 are coupled to a positive input end Lc+1 of the first local oscillation signal. Drains of the transistor VT13 and VT15 are coupled to a positive input end Out+ of the first output signal, and drains of the transistors VT14 and VT16 are coupled to a negative input end Out1− of the first output signal.

The second mixing module 112 includes a transistor VT21, a transistor VT22, a transistor VT23, a transistor VT24, a transistor VT25, a transistor VT26 and a constant current source I12. A gate of the transistor V21 is coupled to a positive input end In+ of the input signal, and a gate of the transistor VT22 is coupled to a negative input end In− of the input signal. Sources of the transistors VT21 and VT22 are coupled to an anode of the constant current source I12, and a cathode of the constant current source I12 is grounded. A drain of the transistor VT21 is coupled to sources of the transistors VT23 and VT24. A drain of the transistor VT22 is coupled to sources of the transistors VT25 and VT26. Gates of the transistors VT23 and VT26 are coupled to a negative input end Lc− of the second local oscillation signal, and gates of the transistors VT24 and VT25 are coupled to a positive input end Lc2+ of the second local oscillation signal. Drains of the transistors VT23 and VT25 are coupled to a positive input end Out2+ of the second output signal, and drains of the transistors VT24 and VT26 are coupled to a negative input end Out2− of the second output signal.

The adding module 113 includes a resistor R1, a resistor R2 and a power supply VC. The resistor R1 has one end coupled to positive input ends of the first output signal and the second output signal, and the other end coupled to the power supply VC. The resistor R2 has one end coupled to negative input ends of the first output signal and the second output signal, and the other end coupled to the power supply VC.

In the embodiment, the constant current source I11 and the constant current source I12 provide constant currents; the transistors VT11 and VT12 as well as the transistors VT21 and VT22 convert differences of the input signals to differential input signals. The resistors R1 and R2 are pull-up resistors, and provide different output voltages for the signals generated from adding the first output signal and the second output signal.

Figure 6:
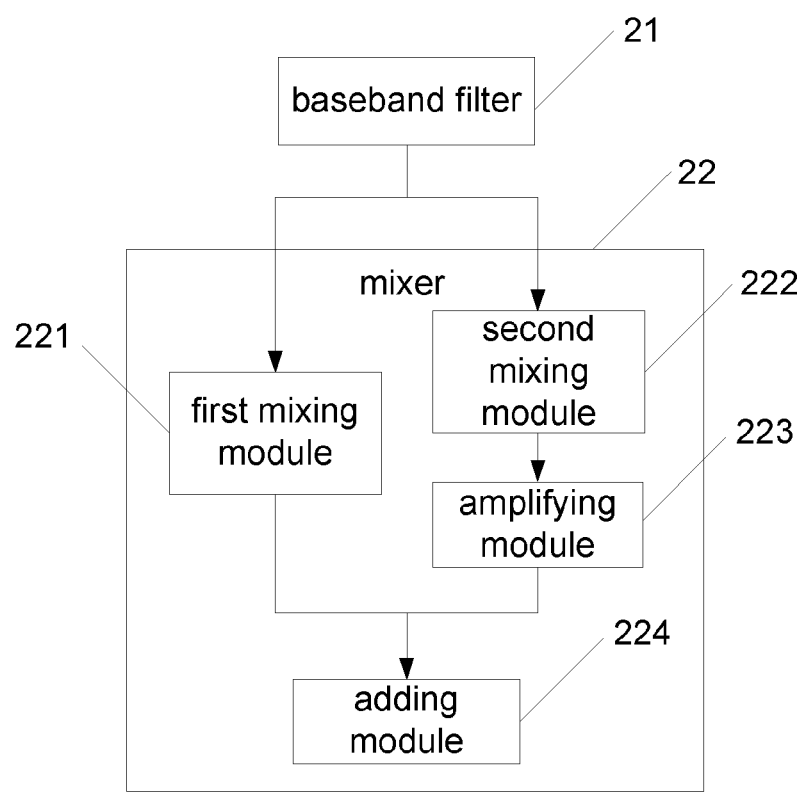
FIG. 6 is a schematic diagram of a device for suppressing harmonic signals according to the second embodiment of the present invention.

FIG. 6 shows a schematic diagram of a device for suppressing harmonic signals according to the second embodiment of the present invention. As shown in FIG. 6, the device includes a baseband filter 21 and a mixer 22.

The baseband filter 21 filters a baseband signal to obtain an input signal having a baseband frequency $f_{BB}$.

The mixer 22 is coupled to the baseband filter 21, and up-mixes the input signal. More specifically, the mixer 22 includes a first mixing module 221, a second mixing module 222, an amplifying module 223 and an adding module 224.

The first mixing module 221, coupled to the baseband filter 21, obtains the input signal from the baseband filter 21, and mixes a first local oscillation signal with the input signal to obtain a first output signal. The first output signal includes an n-order harmonic signal, which includes signals having frequencies $n*f_{LO} \pm f_{BB}$ and $n*f_{LO} \pm n*f_{BB}$, where $f_{LO}$ is a local oscillation frequency and n is a positive integer greater than 1.

The second mixing module 222, coupled to the baseband filter 21, obtains the input signal from the baseband filter 21, and mixes a second local oscillation signal with the input signal to obtain a second output signal.

The amplifying module 223, coupled to the second mixing module 222, obtains the second output signal from the second mixing module 222, and amplifies the amplitude of the second output signal.

The adding module 224, coupled to the first mixing module 221 and the amplifying module 223, adds the first output signal and the amplified second output signal to suppress the n-order harmonic signal in the first output signal.

The first local oscillation signal is a square-wave signal having a mark-space ratio of 100%, the second local oscillation signal is a square-wave signal having a mark-space ratio of 50%, and the phase of the second local oscillation signal is behind the phase of the first local oscillation signal by 45 degrees.

Figure 7:
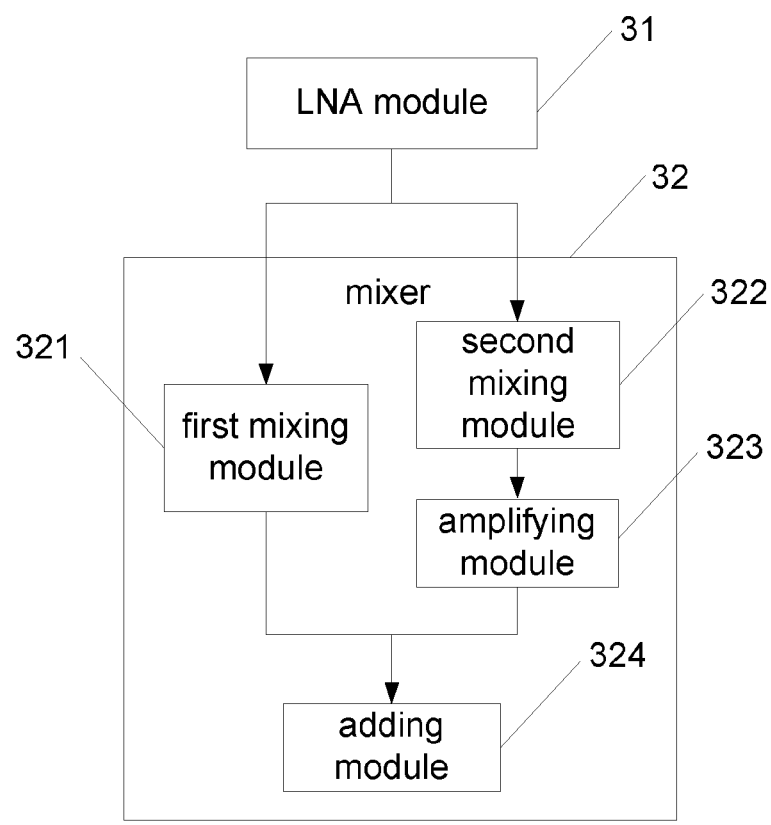
FIG. 7 is a schematic diagram of a device for suppressing harmonic signals according to the third embodiment of the present invention.

FIG. 7 shows a schematic diagram of a device for suppressing harmonic signals according to the third embodiment of the present invention. As shown in FIG. 6 the device includes an LNA 31 and a mixer 32. The mixer 32 includes a first mixing module 321, a second mixing module 322, an amplifying module 323 and an adding module 324.

The LNA 31 amplifies an RF signal to obtain an input signal having a frequency $f_{RF}$. The mixer 32 is coupled to the LNA 31, and down-mixes the input signal. More specifically, the first mixing module 321 and the second mixing module 322 are coupled to the LNA 31.

The first mixing module 321, the second mixing module 322, the amplifying module 323 and the adding module 324 are similar to the first mixing module 221, the second mixing module 222, the amplifying module 223 and the adding module 224 of the second embodiment in FIG. 6. For the sake of simplicity, such repeated details are omitted herein.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for suppressing harmonic signals, comprising:

providing a mixer comprising: a first mixing module; a second mixing module; and an adding module, wherein the first mixing module comprises a first transistor, a second transistor, a third transistor, a fourth transistor, a fifth transistor, a sixth transistor and a first constant current source, a gate of the first transistor is coupled to a positive input end of an input signal, a gate of the second transistor is coupled to a negative input end of the input signal, sources of the first transistor and the second transistor are coupled to an anode of the first constant current source, a cathode of the first constant current source is grounded, a drain of the first transistor is coupled to sources of the third transistor and the fourth transistor, a drain of the second transistor is coupled to sources of the fifth transistor and the sixth transistor, gates of the third transistor and the sixth transistor are coupled to a negative input end of a first local oscillation signal, gates of the fourth transistor and the fifth transistor are coupled to a positive input end of the first local oscillation signal, drains of the third transistor and the fifth transistor are coupled to a positive input end of a first output signal, and drains of the fourth transistor and the sixth transistor are coupled to a negative input end of the first output signal;

mixing the first local oscillation signal with the input signal by the first mixing module to obtain the first output signal, and mixing a second local oscillation signal with the input signal by the second mixing module to obtain a second output signal, the first output signal comprising an n-order harmonic signal, n being a positive integer greater than 1; and adding the first output signal and the second output signal by the adding module to suppress the n-order harmonic signal in the first output signal;

wherein, the first local oscillation signal and the second local oscillation signal have different mark-space ratios but a same local oscillation frequency.

2. The method for suppressing harmonic signals according to claim 1, further comprising:

filtering a baseband signal with a baseband filter to obtain the input signal;

wherein, the n-order harmonic signal comprises a signal having frequencies $n*f_{LO} \pm f_{BB}$ and $n*f_{LO} \pm n*f_{BB}$, $f_{LO}$ is the local oscillation frequency, and $f_{BB}$ is a baseband frequency of the input signal.

3. The method for suppressing harmonic signals according to claim 1, further comprising:

amplifying a radio-frequency (RF) signal with a low-noise amplifier to obtain the input signal;

wherein, the n-order harmonic signal comprises a signal having frequencies $n*f_{LO} \pm f_{RF}$ and $n*f_{LO} \pm n*f_{RF}$, $f_{LO}$ is the local oscillation frequency, and $f_{RF}$ is a frequency of the input signal.

4. The method for suppressing harmonic signals according to claim 1, before the step of adding the first output signal and the second output signal, the method further comprising:

amplifying an amplitude of the second output signal.

5. The method for suppressing harmonic signals according to claim 1, wherein the first local oscillation signal is a square-wave signal having a mark-space ratio of 100%, and the second local oscillation signal is a square-wave signal having a mark-space ratio of 50%.

6. The method for suppressing harmonic signals according to claim 5, wherein a phase of the second local oscillation signal is behind a phase of the first local oscillation signal by 45 degrees.

7. The method for suppressing harmonic signals according to claim 1, wherein the n-order harmonic signal comprises a three-order harmonic signal or a five-order harmonic signal.

8. A device for suppressing harmonic signals, comprising:
a mixer, comprising:
a first mixing module, configured to mix a first local oscillation signal with an input signal to obtain a first output signal, the first output signal comprising an n-order harmonic signal, n being a positive integer greater than 1;

a second mixing module, configured to mix a second local oscillation signal with the input signal to obtain a second output signal; and an adding module, configured to add the first output signal and the second output signal to suppress the n-order harmonic signal in the first output signal;

wherein, the first local oscillation signal and the second local oscillation signal have different mark-space ratios but a same local oscillation frequency, the first mixing module comprises a first transistor, a second transistor, a third transistor, a fourth transistor, a fifth transistor, a sixth transistor and a first constant current source; a gate of the first transistor is coupled to a positive input end of the input signal, a gate of the second transistor is coupled to a negative input end of the input signal, sources of the first transistor and the second transistor are coupled to an anode of the first constant current source, a cathode of the first constant current source is grounded, a drain of the first transistor is coupled to sources of the third transistor and the fourth transistor, a drain of the second transistor is coupled to sources of the fifth transistor and the sixth transistor, gates of the third transistor and the sixth transistor are coupled to a negative input end of the first local oscillation signal, gates of the fourth transistor and the fifth transistor are coupled to a positive input end of the first local oscillation signal, drains of the third transistor and the fifth transistor are coupled to a positive input end of the first output signal, and drains of the fourth transistor and the sixth transistor are coupled to a negative input end of the first output signal.

9. The device for suppressing harmonic signals according to claim 8, wherein the second mixing module comprises a seventh transistor, an eighth transistor, a ninth transistor, a tenth transistor, an eleventh transistor, a twelfth transistor and a second constant current source; a gate of the seventh transistor is coupled to a positive input end of the input signal, a gate of the eighth transistor is coupled to a negative input end of the input signal, sources of the seventh transistor and the eighth transistor are coupled to an anode of the second constant current source, a cathode of the second constant current source is grounded, a drain of the seventh transistor is coupled to sources of the ninth transistor and the tenth transistor, a drain of the eighth transistor is coupled to sources of the eleventh transistor and the tenth transistor, gates of the ninth transistor and the twelfth transistor are coupled to a negative input end of the second local oscillation signal, gates of the tenth transistor and the eleventh transistor are coupled to a positive input end of the second local oscillation signal, drains of the ninth transistor and the eleventh transistor are coupled to a positive input end of the second output signal, and drains of the tenth transistor and the twelfth transistor are coupled to a negative input end of the second output signal.

10. The device for suppressing harmonic signals according to claim 9, wherein the adding module comprises a first resistor, a second resistor and a power supply; the first resistor has one end coupled to the positive input ends of the first output signal and the second output signal, and one other end coupled to the power supply; the second resistor has one end coupled to the negative input ends of the first output signal and the second output signal, and one other end coupled to the power supply.

11. The device for suppressing harmonic signals according to claim 9, further comprising:
a baseband filter, configured to filter a baseband signal to obtain the input signal;
wherein, the n-order harmonic signal comprises a signal having frequencies $n*f_{LO} \pm f_{BB}$ and $n*f_{LO} \pm n*f_{BB}$, $f_{LO}$ is the local oscillation frequency, and $f_{BB}$ is a baseband frequency of the input signal.

12. The device for suppressing harmonic signals according to claim 8, further comprising:
a low-noise amplifier, configured to amplify an RF signal to obtain the input signal;
wherein, the n-order harmonic signal comprises a signal having frequencies $n*f_{LO} \pm f_{RF}$ and $n*f_{LO} \pm n*f_{RF}$, $f_{LO}$ is the local oscillation frequency, and $f_R$ is a frequency of the input signal.

13. The device for suppressing harmonic signals according to claim 8, wherein the mixer further comprises an amplifying module, and the amplifying module obtains the second output signal from the second mixing module and amplifies an amplitude of the second output signal.

14. The device for suppressing harmonic signals according to claim 8, wherein the first local oscillation signal is a square-wave signal having a mark-space ratio of 100%, and the second local oscillation signal is a square-wave signal having a mark-space ratio of 50%.

15. The device for suppressing harmonic signals according to claim 14, wherein a phase of the second local oscillation signal is behind a phase of the first local oscillation signal by 45 degrees.

16. The device for suppressing harmonic signals according to claim 8, wherein the n-order harmonic signal comprises a three-order harmonic signal or a five-order harmonic signal.

* * * * *